United States Patent [19]
Moslehi et al.

[11] Patent Number: 5,453,124
[45] Date of Patent: Sep. 26, 1995

[54] PROGRAMMABLE MULTIZONE GAS INJECTOR FOR SINGLE-WAFER SEMICONDUCTOR PROCESSING EQUIPMENT

[75] Inventors: Mehrdad M. Moslehi, Dallas; Cecil J. Davis, Greenville; Robert T. Matthews, Plano, all of Tex.

[73] Assignee: Texas Instruments Incorporated, Dallas, Tex.

[21] Appl. No.: 261,650

[22] Filed: Jun. 17, 1994

Related U.S. Application Data

[63] Continuation of Ser. No. 90,556, Jul. 12, 1993, abandoned, which is a continuation of Ser. No. 815,718, Dec. 30, 1992, abandoned.

[51] Int. Cl.⁶ .................................................. C23C 16/00
[52] U.S. Cl. .................................. 118/715; 118/725
[58] Field of Search ........................... 118/715, 725

[56] References Cited

U.S. PATENT DOCUMENTS

| | | | |
|---|---|---|---|
| 3,854,443 | 12/1974 | Baerg | 118/730 |
| 4,369,031 | 1/1983 | Goldman | 118/715 |
| 4,980,204 | 12/1990 | Fujii | 118/715 |
| 4,993,358 | 2/1991 | Mahawili | 118/715 |
| 5,045,496 | 9/1991 | Hess | 437/81 |
| 5,134,965 | 8/1992 | Tokuda et al. | 118/723 |

FOREIGN PATENT DOCUMENTS

| | | | |
|---|---|---|---|
| 0318395 | 11/1988 | European Pat. Off. | |
| 4142877A1 | 12/1991 | Germany. | |
| 60-189928 | 9/1985 | Japan. | |
| 61-005515 | 1/1986 | Japan | 118/715 |
| 62-081019 | 4/1987 | Japan | 118/715 |
| 63-053932 | 3/1988 | Japan | 118/715 |
| 63-124528 | 5/1988 | Japan | 118/715 |
| 1-223724 | 9/1989 | Japan | 118/715 |
| 1287277 | 11/1989 | Japan. | |
| 2-200784 | 8/1990 | Japan | 118/723 |
| 3-281780 | 12/1991 | Japan | 118/715 |

*Primary Examiner*—Richard Bueker
*Attorney, Agent, or Firm*—Jacqueline J. Garner; Richard L. Donaldson; William E. Hiller

[57] ABSTRACT

A programmable multizone fluids injector for use in single-wafer semiconductor processing equipment including an injector having a plurality of orifices therein which are divided into a number of separate zones or areas. These zones or areas are connected by means of appropriate passageways and conduits to a source of process fluids. Each of the separate conduits has at least one flow control device located therein for independently controlling the amounts and ratios of process fluids flowing into each zone. The fluid control devices are responsive to input signals so that the fluid flow rates from the orifices can maintain a desired flow pattern within the process chamber to suit the individual needs of a particular fabrication processs.

4 Claims, 6 Drawing Sheets

PROGRAMMABLE MULTIZONE GAS INJECTOR FOR SINGLE-WAFER SEMICONDUCTOR PROCESSING EQUIPMENT

This application is a Continuation of application Ser. No. 08/090,556, filed Jul. 12, 1993, abandoned, which is a Continuation of Ser. No. 07/815,718, filed Dec. 30, 1992, abandoned.

TECHNICAL FIELD OF THE INVENTION

This invention relates generally to single-wafer processes involving the production of semiconductor devices. More particularly, but not by way of limitation, this invention relates to a multizone gas injector wherein the individual zones of the injector can be controlled as desired to provide uniform or non-uniform adjustable delivery of a process gas or a combination of process gases over the surface of a semiconductor wafer within a fabrication equipment.

BACKGROUND OF THE INVENTION

Among the difficulties encountered when attempting to perform a fabrication process (such as deposition or etch) on a semiconductor wafer is the difficulty of maintaining maximum process uniformity within the wafer. Most semiconductor fabrication processes, including etch and deposition processes, are activated thermally or via mass transport (or their combination). Thus, good process uniformity usually requires adjustments and optimizations of both the wafer temperature uniformity and gas flow pattern. Advanced semiconductor process equipment employ multizone resistive, induction, or lamp-type heat sources to optimize the temperature uniformity within the wafer in order to establish improved process uniformity.

The process uniformity may be also affected by the ability to distribute the process gases according to a desired flow pattern. For the most part, the efforts to alleviate the problems caused by the gas flow patterns and mass transport nonuniformity in the process chamber to establish uniform processes have been in the direction of maintaining absolute uniformity of thickness of the material being deposited or etched. However, since the process uniformity usually depends upon both uniformity temperature within the wafer and mass transport uniformity of the process gases, some applications have relied on adjusting the wafer temperature distribution (which can usually be controlled) in order to compensate for nonuniform mass transport effects.

As an example of the above, in the chemical-vapor deposition (CVD) of tungsten, the deposition uniformity is strongly affected by gas flow patterns as well as the wafer temperature distribution. It is possible to improve the tungsten thickness uniformity by adjusting the wafer temperature distribution. The optimum deposition (thickness) uniformity may require a non-uniform or intentionally distorted wafer temperature. A non-uniform wafer temperature may be required to minimize the undesirable affects of non-uniform reactant concentration or mass transport distribution as well as to eliminate the gas or reactant depletion effects. A distorted non-uniform wafer temperature may overcome the flow non-uniformity effects resulting in a relatively uniform layer thickness. However, an intentionally distorted wafer temperature distribution can cause other problems, such as nonuniformities of other electrical and physical properties. As a result, intentional distortion of the wafer temperature in order to compensate for nonuniform mass transport effects may not be a desirable solution. Mechanical design constraints may contribute to the difficulty of maintaining the uniformity of gas flow from a single-zone gas injector. Accordingly, there is a need for the capability to allow real-time adjustments and control of the gas flow pattern and mass-transport distribution of reactants within the process chamber. This capability is useful in many fabrication processes such as plasma etch, thermal annealing/oxidation, depositions and other fabrication processes.

TECHNICAL ADVANTAGES

One advantage is to provide a programmable multizone gas injector (showerhead) for single-wafer semiconductor processing equipment wherein any number of gas injection zones can be provided.

The invention also provides a technical advantage of being able to control the mass flow through each of the injection areas when and as desired.

The invention provides the technical advantages of the multizone gas injector for the uniform or non-uniform adjustable distribution of the process gases over the semiconductor wafer. The programmable capability of the multizone showerhead of this invention can be fully utilized during various fabrication processes such as low or atmospheric pressure chemical-vapor deposition, etching, epitaxy, or various Other fabrication processes.

SUMMARY OF THE INVENTION

This invention then provides a multizone programmable gas injector for use in single-wafer semiconductor processing equipment that comprises a body member having an end showerhead plate arranged to be located adjacent to the semiconductor wafer, a plurality of orifices extending through the end service, and a plurality of passageways in the body member connected with the orifices and having an inlet for each passageway. The injector also includes a conduit connected with the body member for each inlet that is arranged to be connected to a source of process gases. Adjustable mass flow controllers are located in the conduit for controlling the amounts of process fluids through the orifices and onto the wafer being processed within the process chamber.

BRIEF DESCRIPTION OF THE DRAWING

The foregoing and additional objects and advantages of the invention will become more apparent as the following detailed description is read in conjunction with the accompanying drawing wherein like reference characters denote like parts in all views and wherein.

DETAILED DESCRIPTION OF THE PREFERRED EMBODIMENT

Figure 1:
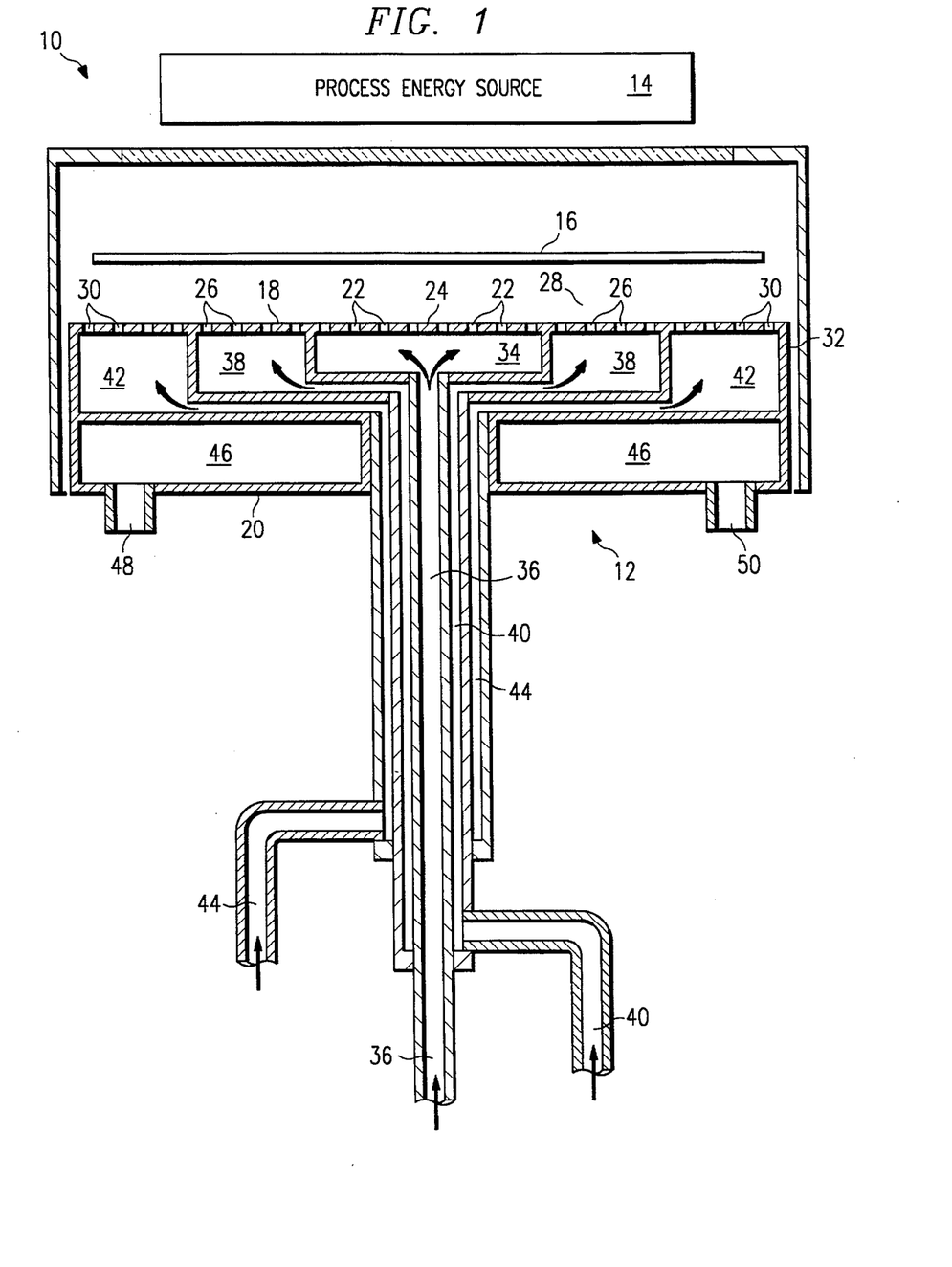
FIG. 1 is an elevation schematic showing in cross section a multizone programmable gas injector that is constructed in accordance with the invention located in a partially illustrated process chamber.

Referring to the drawing and to FIG. 1 in particular, shown therein and generally designated by the reference character 10 is a single-wafer process chamber that is utilized for performing various fabrication processes on semiconductors wafers. As illustrated, chamber 10 is only partially illustrated as encompassing the multizone programmable gas injector 12. The chamber 10 includes process energy source 14 which is preferably a heater or plasma generation source that is designed to provide uniform process over a wafer 16. The heat source is usually used in thermally activated processes such as chemical vapor deposition processes. Other process energy sources such as plasma may be employed during other fabrication processes, such as plasma, etch and plasma-enhanced chemical-vapor deposition (PECVD).

The wafer 16 is supported in an appropriate manner adjacent to the showerhead plate 18 of the gas injector 12. The wafer may be clamped against a heated and/or radio-frequency-powered chuck (e.g. PECVD), or it may be supported on several supported pins without any clamping (e.g. lamp-heated rapid thermal processes). The process chamber is well known and its structure is not shown or described in detail herein.

The showerhead plate 18 is formed on one end of an injector body 20. The showerhead plate 18 includes a plurality of orifices 22 that extend therethrough and that are located in a center portion or zone 24 of the injector 12.

Showerhead plate 18 also includes a plurality of orifices 26 that are arranged in an annular configuration encircling the center portion 24 forming a middle portion or zone 28. In addition, a third series of orifices 30 encircle the orifices 26. The orifices 30 are located adjacent to an outer periphery 32 of the showerhead plate 18 and are also arranged in an annular configuration.

The orifices 22 connect with a passageway 34 that is formed in the center of the body member 20. The passageway 34 is connected to a conduit 36 that extends from the body member 20. Similarly, the orifices 26 are connected to a passageway 38 that is connected to a conduit 40 but also extends from the body member 20. In like fashion, the orifices 30 are connected to a passageway 42 that is in turn connected to a conduit 44 that extends from the body member 20.

As illustrated, the lower portion of the body member 20 is hollow and includes a temperature control chamber 46 having an inlet 48 and an outlet 50. Preferably, the inlet and outlet are connected so that a temperature control fluid flows through the chamber 46 to heat or cool the injector body member 20 and showerhead plate 18 during the processing of the wafer 16.

Figure 2:
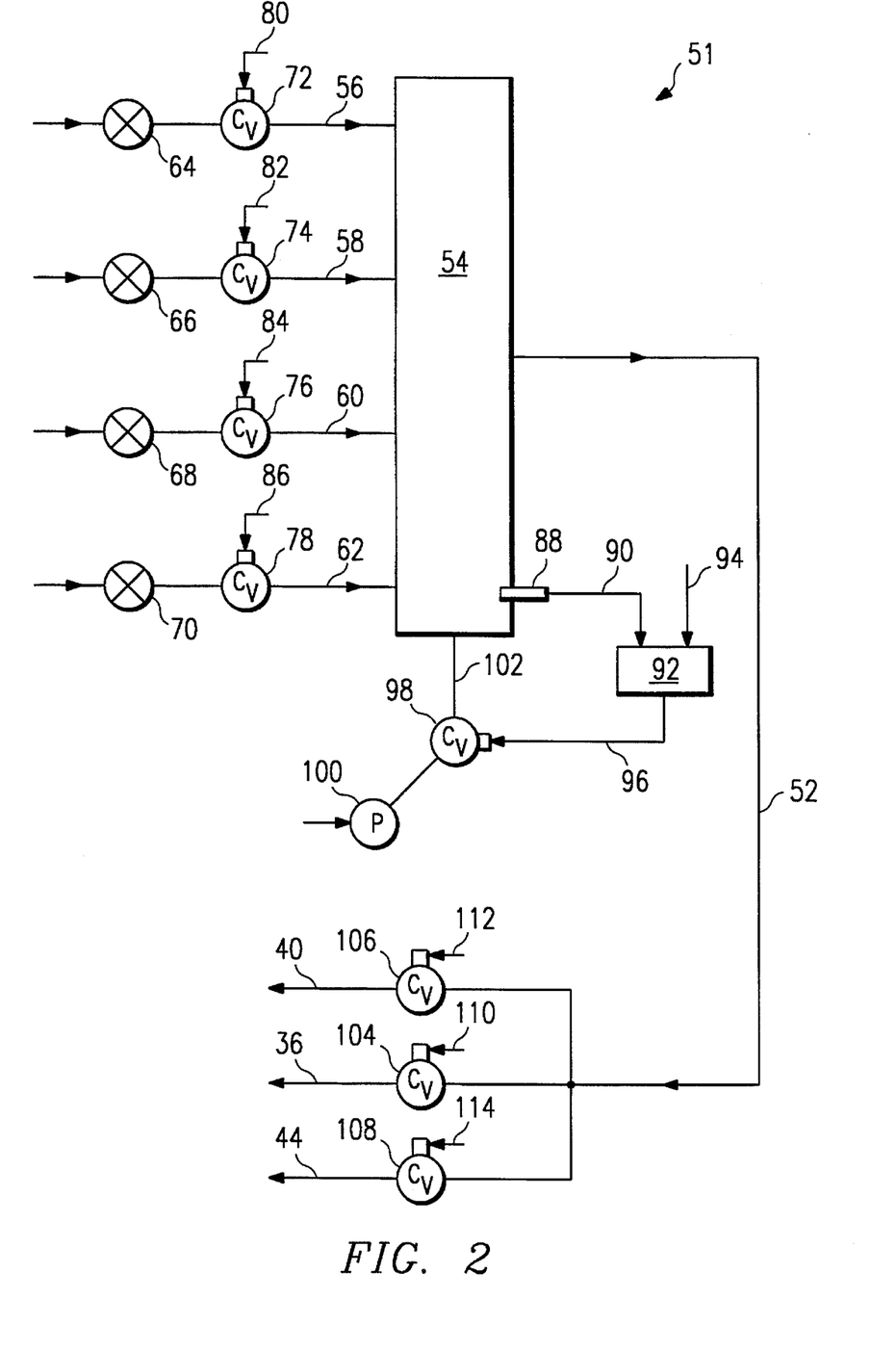
FIG. 2 is a schematic drawing illustrating the process gas control system that is used in conjunction with the showerhead or injector shown in FIG. 1 and that is also constructed in accordance with the invention.

FIG. 2 illustrates a fluid control and distribution network that is associated with the injector 12 and is generally indicated by the reference character 51. At the lower portion of FIG. 2, can be seen the conduits 36, 40 and 44 which extend into the head member 20 as previously described.

It will be noted that the flow control and distribution system 51 provides a means of connecting the injector 12 with a variety of process gases. The conduits 36, 40 and 44 are branch conduits which extend from an outlet conduit 52 that has its opposite end connected to a process gas mixing manifold 54. The manifold 54 is in turn connected by conduits 56, 58, 60 and 62 with four separate supplies of process gases which may, for example, be hydrogen, argon, silane ($SiH_4$) and tungsten hexafluoride ($WF_6$). Depending on the process, the number of input process gas channels may vary.

Interposed in each of the conduits 56, 58, 60 and 62 are on/off valves 64, 66, 68 and 70, respectively. Also interposed in the conduit 56, 58, 60 and 62 between the on/off valves and the manifold 54 are mass flow controllers 72, 74, 76 and 78, respectively. The mass flow controllers are each responsive to an input control signal 80, 82, 84 or 86 which may be imposed either manually or in response to a process control computer. Manifestly, other process gases may be utilized in lieu of those listed above if desired.

It is necessary to maintain the manifold gas pressure to a value at least slightly above the pressure being utilized in the process chamber 10 in order to introduce the gas therein. Accordingly, the manifold 54 is provided with a pressure sensor 88 which transmits a signal 90 indicative of the pressure in the manifold 54 to a controller 92. In the controller 92, the signal 90 is compared to a set point or desired pressure 94. The controller 92 transmits an output control signal 96 that is indicative of the desired manifold pressure to a flow control valve 98 which is operating in conjunction with a pump 100. The pump 100 works in conjunction with the flow control valve 98 and control signal 96 to establish the desired manifold gas pressure. This manifold pressure control will ensure proper operation of the mass flow controllers 104, 106, 108 in the gas distribution network 51.

Depending upon which gas or combination of gases has been selected for the process, the process gases flow through the outlet conduit 52 and into the three branch conduits 36, 40 and 44. Before the gases reach the injector 12, they must pass through mass-flow controllers 104, 106 or 108 which are each located in a respective one of the branch conduits. The mass-flow controllers 104, 106 and 108 are responsive to control signals 110, 112 or 114 to determine the amounts and ratios of gases flowing through each of the branch conduits 36, 40 and 42.

If in a process, it is desired that each of the zones of the injector 12 should have equal gas flow rates, then signals 110, 112 and 114 will be imposed upon the valves 104, 106 and 108 so that the flow rates through the branch conduits 36, 40 and 44 will be equal. If, on the other hand, it is desired that 50 percent of the total gas flow rate should flow through the outer annular zone of orifices 30, then the control signal 114 changes the flow characteristics of the valve 108 so that 50 percent of the gas is flowing through the branch conduit 44 into the passageway 42 and out of the orifices 30. Manifestly, the flow through the other two conduits may be divided equally or in any proportion desired by simply imposing appropriate control signals on the mass-flow controllers 104–108.

Figure 3:
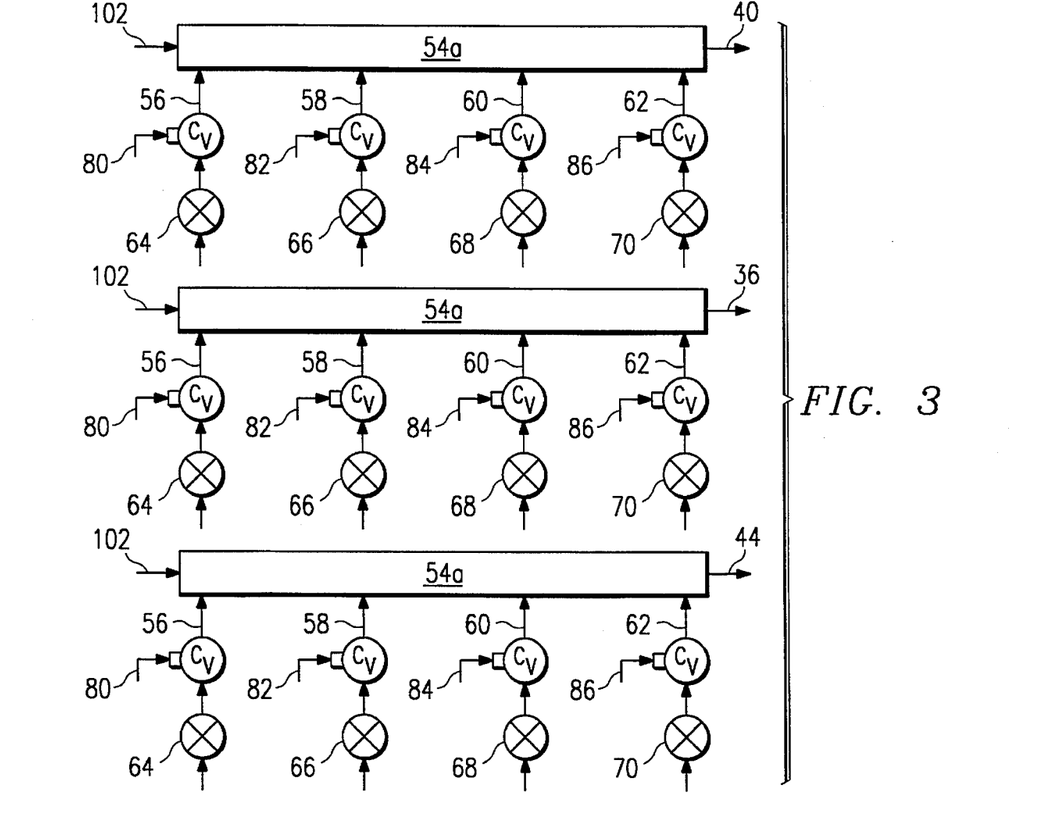
FIG. 3 is a schematic drawing similar to FIG. 2, but illustrating another process gas control system that is used in conjunction with the injector shown in FIG. 1 and that is also constructed in accordance with the invention.

MODIFIED GAS CONTROL SYSTEM OF FIG. 3

In the description of the gas control system of FIG. 2, it will be noted that the mass flow controllers or valves 72, 74, 76 and 78 upstream of the manifold 54 are cascaded with respect to the mass flow controllers located in the branch conduits 36, 40 and 44. Cascading of the control valves in the system 51 shown in FIG. 2 is necessary since it is sometimes desirable to mix one or more of the gases flowing through the conduits 56, 58, 60 or 62. The controllers upstream of the manifold 54 are necessary in order to provide the proper proportions of process fluids into the manifold 54. Since there is only one outlet conduit 52 from the manifold 54, it is necessary to have the flow control valves 104, 106 and 108 in each of the conduits 36, 40 and 44, respectively, to control the flow rates into each of the flow zones in the injector 12.

With the system shown in FIG. 3, three separate manifolds are utilized, that is, manifolds 54a, 54b and 54c. The conduits 36, 40 and 44 which lead into the injector 12 are each connected to one of the mixing manifolds.

It will be noted that each of the manifolds 54a, 54b and 54c is provided with a plurality of conduits 56, 58, 60 and 62 which corresponds to the same conduits shown in the gas flow control system 51 of FIG. 2. Similarly, each is provided with an on/off valve 64, 66, 68 and 70.

One of the advantages of the system of FIG. 3 is that a different gas or a different mixture of gases can be provided to each of the flow zones in the injector 12. Also, the variation in the mixture in a single flow zone during a process on the wafer 16 can be controlled by varying the appropriate flow control valve 64, 66, 68, or 70 which are also located in each of the conduits as previously described. Since each of the manifolds is provided with its own outlet conduit, it is not necessary to further control the flow into the injector 12 as it is in the case of the gas flow control system 51 of FIG. 2. Although not shown in detail, each of the manifolds 54a, 54b and 54c can be provided with a pressure control system as described in connection with the embodiment of FIG. 2. Conduits 102, which are indicated as extending into the manifolds, are shown for this purpose. They may be omitted if not needed.

In the operation of the injector 12, when connected with the gas flow control system of FIG. 3, a selected mixture of gases is introduced into the manifold 54a through the appropriate conduits and the mixed gas exits through the outlet conduit 40 flowing into the injector 12 through the passageways 38 and out of the orifices 26 into the intermediate annular gas flow zone 28.

Similarly, the desired gases are introduced into the manifold 54b where they mix and flow outwardly through the conduit 36 which flows through the passageways 34 into the injector 12 and outwardly through the orifices 22 into the center zone 24 of gas flow. One or a plurality of gases can be introduced into the manifold 54c from which the gas flows through the outlet conduit 44 into the injector 12 through the passageways 42 and outwardly through the orifices 30 in the outer annular gas flow zone of the injector 12.

It will be appreciated that the mixture and ratios of gases can be varied or maintained constant in various flow zones as desired by introducing the proper input control signals 80, 82, 84 and 86 into the various flow control valves in the gas flow control system of FIG. 3. In this manner, the composition of the mixtures can be varied and the volume of the gas flowing through each of the outlet conduits can be varied by utilization of parallel arranged flow control valves. The difficulty of controlling the cascaded or series arranged flow control valves of FIG. 2 is thus avoided. Note that the control signals 64, 66, 68, and 70 of the mass-flow controllers on various manifolds 54a, 54b, and 54c are independent and can be controlled separately (a total of 12 separate mass-flow control signals shown in FIG. 3).

STRUCTURE OF THE INJECTOR 12

Figure 4:
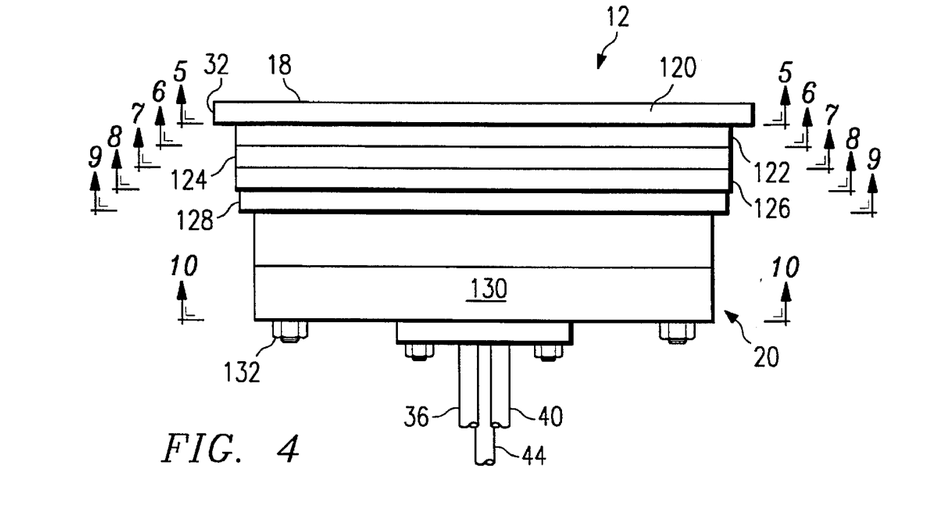
FIG. 4 is an elevation view (not to scale) of a gas injector that is constructed in accordance with the invention.

FIGS. 4–10 illustrate the construction of an injector 12 that incorporates the theory of the schematic injector diagram of FIG. 1. As shown in FIG. 4, the injector 12 includes a top showerhead plate 120, a center zone plate 122, an intermediate zone plate 124, and an outer annular zone plate 126. The injector body 20 also includes a temperature control section 128 and a bottom plate 130 that completes the formation of the temperature control chamber 46. A series of threaded fasteners 132 extend through the body 20 holding the various plates in assembled and oriented relationship.

Figure 5:
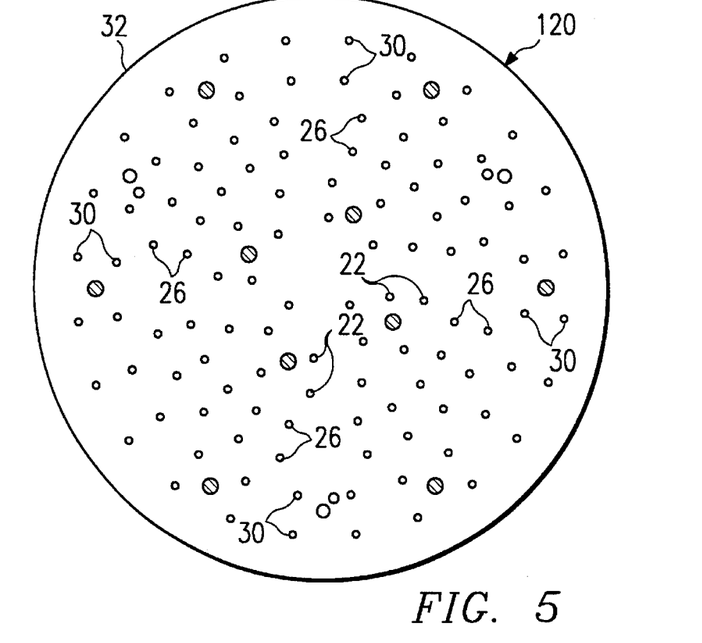
FIG. 5 is a top plan view of a top plate or showerhead plate of the injector of FIG. 4 that is taken generally along the line 5—5 of FIG. 4.

FIG. 5 illustrates a plan view of the top showerhead plate 120. In addition to the outer peripheral surface 32, the various orifices 22, 26 and 30 can be seen as extending therethrough. Also, the threaded fasteners 132 which serve to orient the plates relative to each other and to hold the body, 20 assembled can be seen. Preferably, the plate 120 will have an outside diameter equal to or larger than the diameter of the wafer 16.

Figure 6:
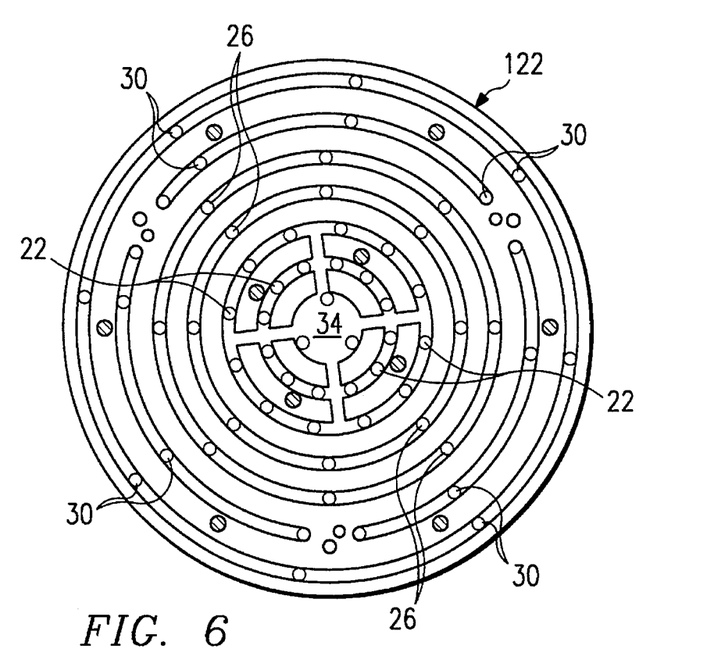
FIG. 6 is a top plan view of a plate utilized to form the center zone for gas flow in the injector of FIG. 4 and taken generally along the line 6—6 of FIG. 4.

The center zone plate 122 is illustrated in the plan view of FIG. 6. As shown therein, the gas flow passageway 34 is illustrated as being a circular recess having radially extending recesses projecting therefrom intersecting annular branch passageways which provide communication between the conduit 36 (see FIG. 1) and the orifices 22 which provide for gas flow through the center zone 24.

Figure 7:
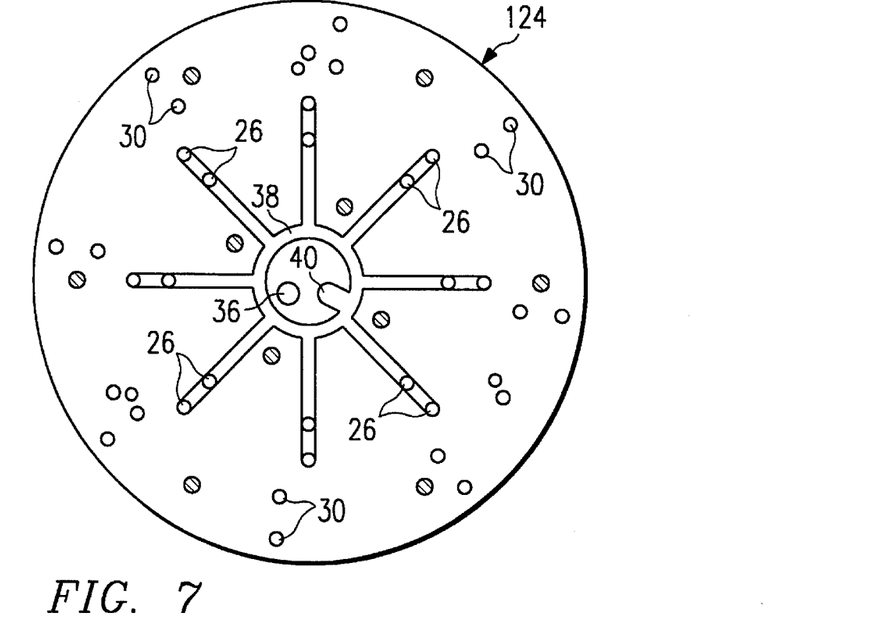
FIG. 7 is a top plan view of a plate utilized to form an annular middle or intermediate gas flow zone in the injector of FIG. 4 and taken generally along the line 7—7 of FIG. 4.

FIG. 7 illustrates the gas flow channels to the intermediate gas flow zone 28. As shown therein, the conduit 40 extends into an annular passageway 38 formed in the plate 124 which then connects into a series of gas flow recesses which connect with the orifices 26 providing gas flow into the zone 28. Also shown therein is the conduit 36 which extends therethrough into the center flow passageway 34 previously mentioned in connection with FIG. 6.

Figure 8:
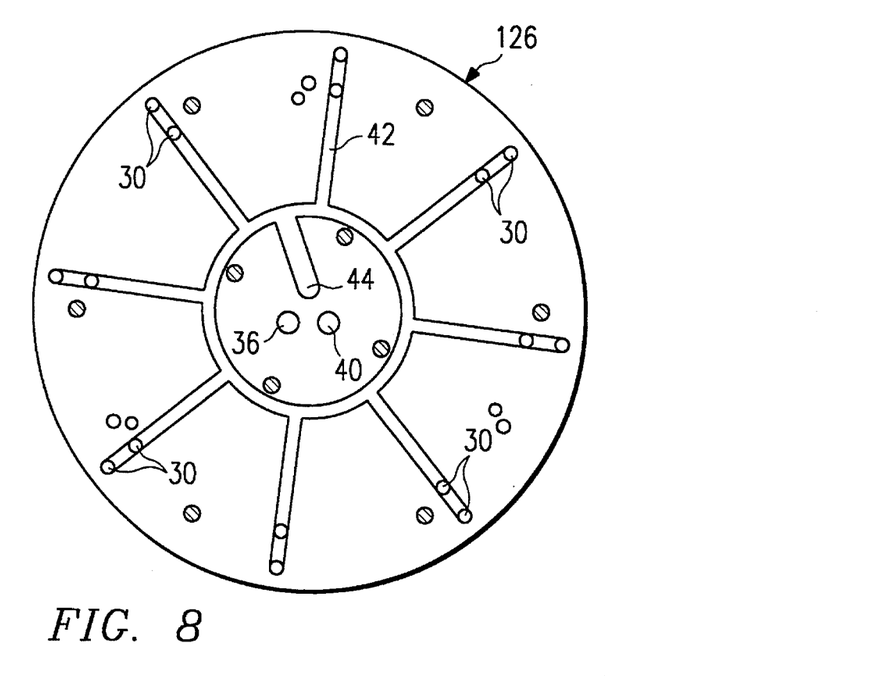
FIG. 8 is a top plan view of a plate used to form an outer annular gas flow zone in the injector FIG. 4 and taken generally along the line 8—8 of FIG. 4.

FIG. 8 shows, in plan view, the gas flow control to the outer zone. As shown therein, the conduit 44 extends radially outwardly through the plate 126 to an annular gas flow passageway which has a plurality of radially extending passageways connecting with the orifices 30 providing gas flow to the outer annular zone of the injector 12. Also shown in FIG. 8 is the conduit 36 extending to the passageway 34 and the conduit 40 which extends to the passageway 38.

Figure 9:
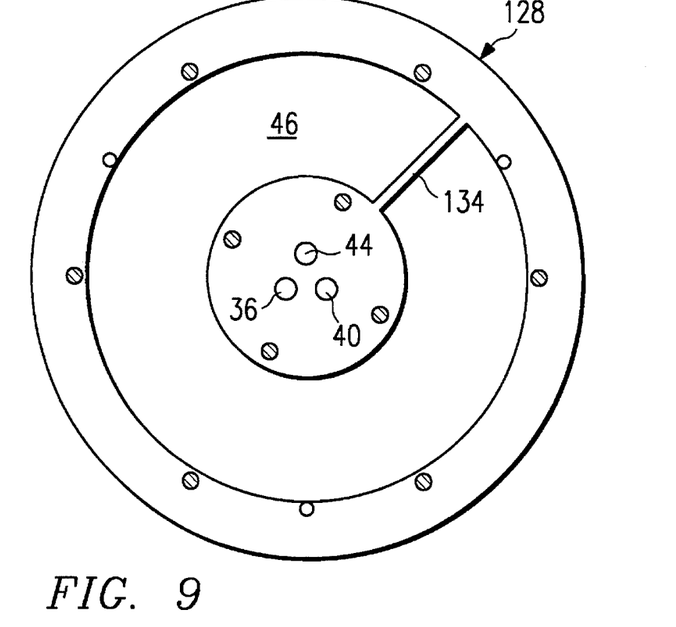
FIG. 9 is a top plan view of a body section of the injector of FIG. 4 utilized to form a temperature control chamber for the programmable injector module and taken generally along the line 9—9 of FIG. 4.

FIG. 9 is a plan view of a section 128 of the injector body 18 which provides the temperature control chamber 46. As illustrated, a partition 134 extends across the temperature control chamber 46. The conduits 36, 40 and 44 which extend into the injector 12 for delivering the process gases to the injector 12 can be clearly seen in FIG. 9.

Figure 10:
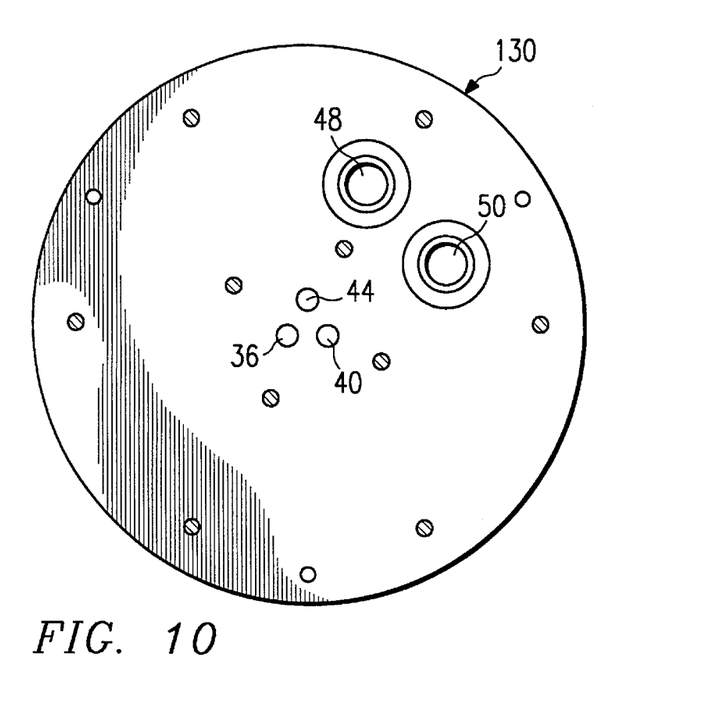
FIG. 10 is a plan view of the bottom plate having the temperature control fluid flow connections therein that closes the chamber formed in the body member of FIG. 9 and that is taken generally along the line 10—10 of FIG. 4.

FIG. 10 is also a plan view showing a plate 130 that extends across the bottom of the body section 128 enclosing the chamber 46. The orientation of the plate 128 is such that the fluid inlet 48 and outlet 50 are positioned on opposite sides of the partition 134. Again, the conduits 36, 40 and 44 can be seen extending through the plate 130.

Although no seals have been illustrated in the structure, it will be understood that the surfaces of the various plates may be finished adequately to provide metal-to-metal seals or appropriate seals capable of withstanding the heat of the various processes will be inserted between the plates to maintain the integrity of the gas flow passageways.

From the foregoing detailed description, it can be seen that the injector 12 and the associated flow control systems can provide the desired gas flow rates through the appropriate orifice zones either equally or in any ratio desired.

Although not illustrated, the mass flow, controller signals (110, 112, 114, as well as 80, 82, 84, and 86) can be imposed on the control valves by a preselected program from a process control computer (not shown) so that the gas flow rates and their ratios can be varied during the execution of any process within the chamber 10.

It will of course be understood that the preferred embodiment illustrates three separates zones of flow control. Manifestly, as many zones of flow control as desired could be included within the apparatus. Moreover, the preferred embodiment employs cylindrically symmetric zones (circular and annular). It is, however, possible to use other zone partitioning configurations as well.

Having described but a single embodiment of the invention, it will be understood that many changes and modifications can be made thereto without departing from the spirit or scope of the invention.

What is claimed is:

1. A multi-zone gas injector for use in a semiconductor processing equipment comprising:

a body member having a showerhead plate arranged to be located adjacent to a wafer;

a plurality of inlet conduits connected with said body member and arranged to be connected to at least one source of process fluids, wherein said source of process fluid is capable of providing a combination of said process fluids;

a plurality of passageways located within said body member, wherein each of said passageways is connected to only one of said inlet conduits; and a plurality of orifices extending through said showerhead plate, wherein each of said orifices is associated with one of said passageways;

wherein said source of process fluid includes:
   a mixing manifold;
   pressure control apparatus connected with said mixing manifold for maintaining a desired manifold pressure therein;
   at least one process fluids conduit connected to said mixing manifold for supplying process fluids to said mixing manifold;
   a control device located in each process fluids conduit for controlling the mass flow of said process fluids into said mixing manifold; and
   an outlet conduit connected to said mixing manifold for delivering said process fluids to said plurality of inlet conduits connected to said body member; and wherein said pressure control apparatus includes:
   a pressure sensor in said mixing manifold for generating a signal indicative of the pressure in the mixing manifold;
   a controller for receiving said signal and comparing said signal to a desired pressure and transmitting an output control signal indicative of the desired pressure;
   pressure controlling apparatus connected with said mixing manifold; and
   a control valve located between said mixing manifold and pressure controlling apparatus, said valve being responsive to said output control signal to regulate the pressure in said mixing manifold.

2. A multizone fluids injector for use in single-wafer semiconductor processing equipment comprising:

a body member having a showerhead plate arranged to be located adjacent to said wafer, a plurality of radially and circumferentially spaced orifices extending through said showerhead plate, a first passageway in said body member having a center circular portion and connected with a first portion of said orifices and having only one first inlet, a second passageway in said body member having a first annular portion surrounding said center circular portion of said first passageway and connected with a second portion of said orifices and having only one second inlet, and a third passageway in said body member having a second annular portion surrounding said first annular portion of said second passageway and connected with a third portion of said orifices and having only one third inlet;

a first conduit connected to said first inlet and arranged to be connected to a source of process fluids;

a second conduit connected to said second inlet and arranged to be connected to said source of process fluids; and a third conduit connected to said third inlet and arranged to be connected to said source of process fluids;

wherein said source of process fluids includes:
   a fluid mixing manifold;
   pressure control apparatus connected with said mixing manifold for maintaining a desired pressure therein;
   a plurality of conduits connected to said mixing manifold for supplying process fluids to said mixing manifold;
   control valves for controlling the mass flow of said process fluids into said mixing manifold; and,
   an outlet conduit connected to said mixing manifold for delivering said process fluids to said first, second, and third conduits connected to said body member; and wherein said pressure control apparatus includes:
   a pressure sensor in said mixing manifold for generating a signal indicative of the pressure in the mixing manifold;
   a controller for receiving said signal and comparing said signal to a desired pressure and transmitting an output control signal indicative of the desired pressure;
   pressure controlling apparatus connected with said mixing manifold;
   a control valve located between said mixing manifold and pressure controlling apparatus, said valve being responsive to said output control signal to regulate the pressure in said mixing manifold.

3. A single-wafer semiconductor processing apparatus comprising:

a process chamber having a plurality of inlet conduits; and a gas distribution system connected to said process chamber, said gas distribution system comprising:

a plurality of gas mixing manifolds each connected to one of said plurality of inlet conduits of said process chamber;

a plurality of process gas supplies each connected to each of said plurality of gas mixing manifolds through a plurality of mass flow controllers; and a pressure control system for maintaining a desired pressure in each of said gas mixing manifolds, wherein said pressure control system comprises, for each gas mixing manifold:

a pressure sensor in the associated gas mixing manifold for generating a signal indicative of the pressure in said associated gas mixing manifold;

a controller for receiving said signal and comparing said signal to a desired pressure for said associated gas mixing manifold and transmitting an output control signal indicative of the desired pressure;

a pressure controlling device connected with said associated gas mixing manifold; and a control valve located between said associated gas mixing manifold and said pressure controlling device, said control valve being responsive to said output control signal to regulate the pressure in said associated gas mixing manifold.

4. The apparatus of claim 3, wherein said process chamber further comprises:

a showerhead plate having a plurality of radially and circumferentially spaced orifices arranged in a plurality of annular zones;

a plurality of passageways, each of said passageways associated with only one of said annular zones and each of said passageways connected to only one of said plurality of inlet conduits.

\* \* \* \* \*